United States Patent
Ryoki

(10) Patent No.: US 9,608,025 B2
(45) Date of Patent: Mar. 28, 2017

(54) IMAGING APPARATUS AND IMAGING SYSTEM

(71) Applicant: CANON KABUSHIKI KAISHA, Tokyo (JP)

(72) Inventor: Tatsuya Ryoki, Kawasaki (JP)

(73) Assignee: Canon Kabushiki Kaisha, Tokyo (JP)

(*) Notice: Subject to any disclaimer, the term of this patent is extended or adjusted under 35 U.S.C. 154(b) by 65 days.

(21) Appl. No.: 14/796,208

(22) Filed: Jul. 10, 2015

(65) Prior Publication Data

US 2016/0035779 A1 Feb. 4, 2016

(30) Foreign Application Priority Data

Jul. 31, 2014 (JP) ................................ 2014-155947

(51) Int. Cl.

| | |
|---|---|
| H04N 3/14 | (2006.01) |
| H04N 5/335 | (2011.01) |
| H01L 27/146 | (2006.01) |
| H01L 31/0352 | (2006.01) |
| H04N 5/353 | (2011.01) |
| H04N 5/363 | (2011.01) |
| H04N 5/3745 | (2011.01) |

(52) U.S. Cl.
CPC .. *H01L 27/14643* (2013.01); *H01L 27/14612* (2013.01); *H01L 27/14636* (2013.01); *H01L 27/14665* (2013.01); *H01L 31/035218* (2013.01); *H04N 5/353* (2013.01); *H04N 5/3532* (2013.01); *H04N 5/363* (2013.01); *H04N 5/3745* (2013.01)

(58) Field of Classification Search
CPC ......... H01L 27/14643; H01L 27/14665; H01L 27/14636; H01L 27/14612; H01L 31/035218; H04N 5/3745; H04N 5/353; H04N 5/3532; H04N 5/363
USPC ........ 348/294–324; 250/208.1; 257/290–292
See application file for complete search history.

(56) References Cited

U.S. PATENT DOCUMENTS

| | | | |
|---|---|---|---|
| 4,117,514 A * | 9/1978 | Terui | .................... H04N 3/1537 257/233 |
| 7,907,196 B2 | 3/2011 | Ogura et al. | |
| 8,049,800 B2 | 11/2011 | Ota | |
| 8,120,681 B2 | 2/2012 | Ryoki et al. | |
| 8,169,525 B2 | 5/2012 | Ryoki et al. | |
| 8,174,600 B2 | 5/2012 | Ogura et al. | |
| 8,218,050 B2 | 7/2012 | Ogura et al. | |
| 8,872,092 B2 | 10/2014 | Ryoki et al. | |

(Continued)

FOREIGN PATENT DOCUMENTS

JP 2010-016594 1/2010

*Primary Examiner* — Yogesh Aggarwal
(74) *Attorney, Agent, or Firm* — Fitzpatrick, Cella, Harper & Scinto

(57) ABSTRACT

Provided is an imaging apparatus includes: a substrate; a photoelectric conversion unit configured to generate a signal charge by photoelectric conversion; a contact wiring of a conductor electrically connected to the photoelectric conversion unit; a transistor including a control electrode, a first main electrode electrically connected to the contact wiring, and a second main electrode; a charge accumulating unit provided in the substrate and electrically connected to the second main electrode of the transistor; and a first switching unit configured to switch connection and disconnection between the control electrode and the first main electrode of the transistor.

16 Claims, 13 Drawing Sheets

(56) References Cited

U.S. PATENT DOCUMENTS

| | | | |
|---|---|---|---|
| 2012/0033117 A1* | 2/2012 | Murata | H04N 5/361 348/294 |
| 2013/0170615 A1* | 7/2013 | Wei | G01T 1/24 378/62 |
| 2014/0131554 A1* | 5/2014 | Ishii | H01L 27/14665 250/208.1 |
| 2015/0070544 A1* | 3/2015 | Smith | H01L 27/14641 348/297 |

* cited by examiner

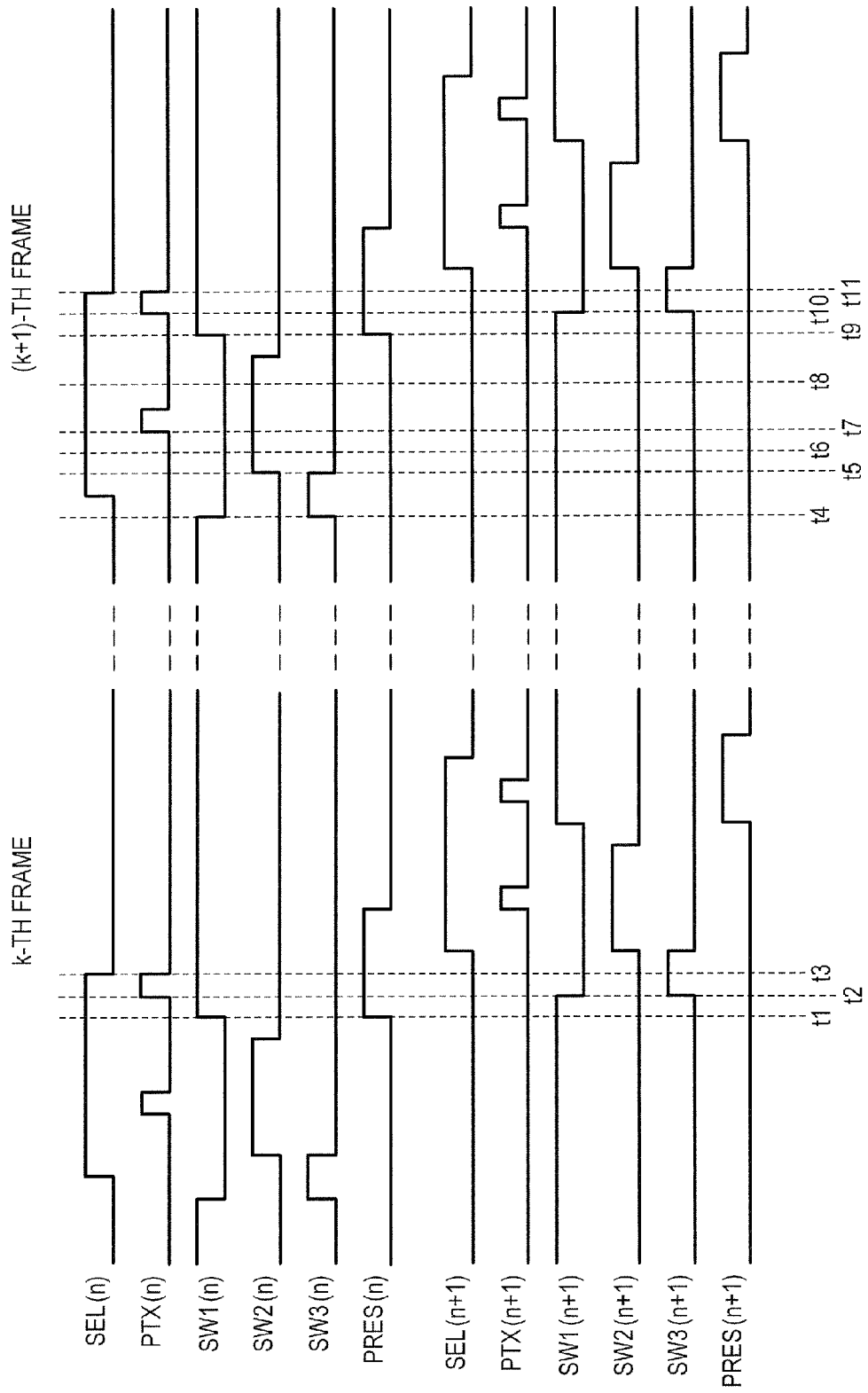

IMAGING APPARATUS AND IMAGING SYSTEM

BACKGROUND OF THE INVENTION

Field of the Invention

The present invention relates to an imaging apparatus and an imaging system.

Description of the Related Art

A stacked imaging apparatus described in Japanese Patent Application Laid-Open No. 2010-16594 has a structure in which a photoelectric conversion layer is formed above a semiconductor substrate in which a pixel circuit such as a charge accumulating unit is formed, with an insulating layer therebetween. A lower electrode in the photoelectric conversion layer and the pixel circuit formed in the semiconductor substrate are electrically connected by a contact wiring or the like.

Japanese Patent Application Laid-Open No. 2010-16594 discloses a structure of adjusting the potential of a connection unit (a diffusion region 3 connected to the lower electrode in the photoelectric conversion layer) and the potential of a potential barrier unit (a region below a gate 7a of a transistor for transferring a charge) to the same potential when exposure starts. This solves a problem in that part of the charge generated in the photoelectric conversion layer remains in the connection unit. The potential of the potential barrier unit is adjusted to a potential predetermined by a potential determination mode. The potential determination mode is a mode of repeatedly checking, while changing the gate potential, whether or not dark current is output, and is described as being used in an adjustment process in an imaging apparatus manufacturing facility and the like in Japanese Patent Application Laid-Open No. 2010-16594.

In an imaging apparatus using a buried photodiode formed in a substrate, the buried photodiode can be fully depleted, i.e. can fully discharge the charge accumulated therein by photoelectric conversion. Accordingly, when transferring a signal from the buried photodiode to a charge detection unit, full charge transfer is possible. Therefore, no kTC noise associated with charge transfer occurs. In the structure of the stacked imaging apparatus as in Japanese Patent Application Laid-Open No. 2010-16594, however, the charge is not fully transferred, and kTC noise may occur when turning off a transistor of the potential barrier unit after the charge transfer.

To reduce such kTC noise, the potential of the potential barrier unit needs to be adjusted according to the amount of signal generated in the photoelectric conversion layer of each pixel. However, with the potential adjustment method by the potential determination mode described in Japanese Patent Application Laid-Open No. 2010-16594, it is difficult to adjust the potential according to the amount of signal generated, upon reading the signal. The structure and reading method described in Japanese Patent Application Laid-Open No. 2010-16594 thus have a problem of lower image quality caused by kTC noise during charge transfer and the like.

SUMMARY OF THE INVENTION

An imaging apparatus according to an aspect of the present invention includes: a substrate; a photoelectric conversion unit configured to generate a signal charge by photoelectric conversion; a contact wiring of a conductor electrically connected to the photoelectric conversion unit; a transistor including a control electrode, a first main electrode electrically connected to the contact wiring, and a second main electrode; a charge accumulating unit provided in the substrate and electrically connected to the second main electrode of the transistor; and a first switching unit configured to switch connection and disconnection between the control electrode and the first main electrode of the transistor.

Further features of the present invention will become apparent from the following description of exemplary embodiments with reference to the attached drawings.

BRIEF DESCRIPTION OF THE DRAWINGS

FIG. 4 is a drive timing chart of the imaging apparatus according to the first embodiment.

DESCRIPTION OF THE EMBODIMENTS

Figure 1:
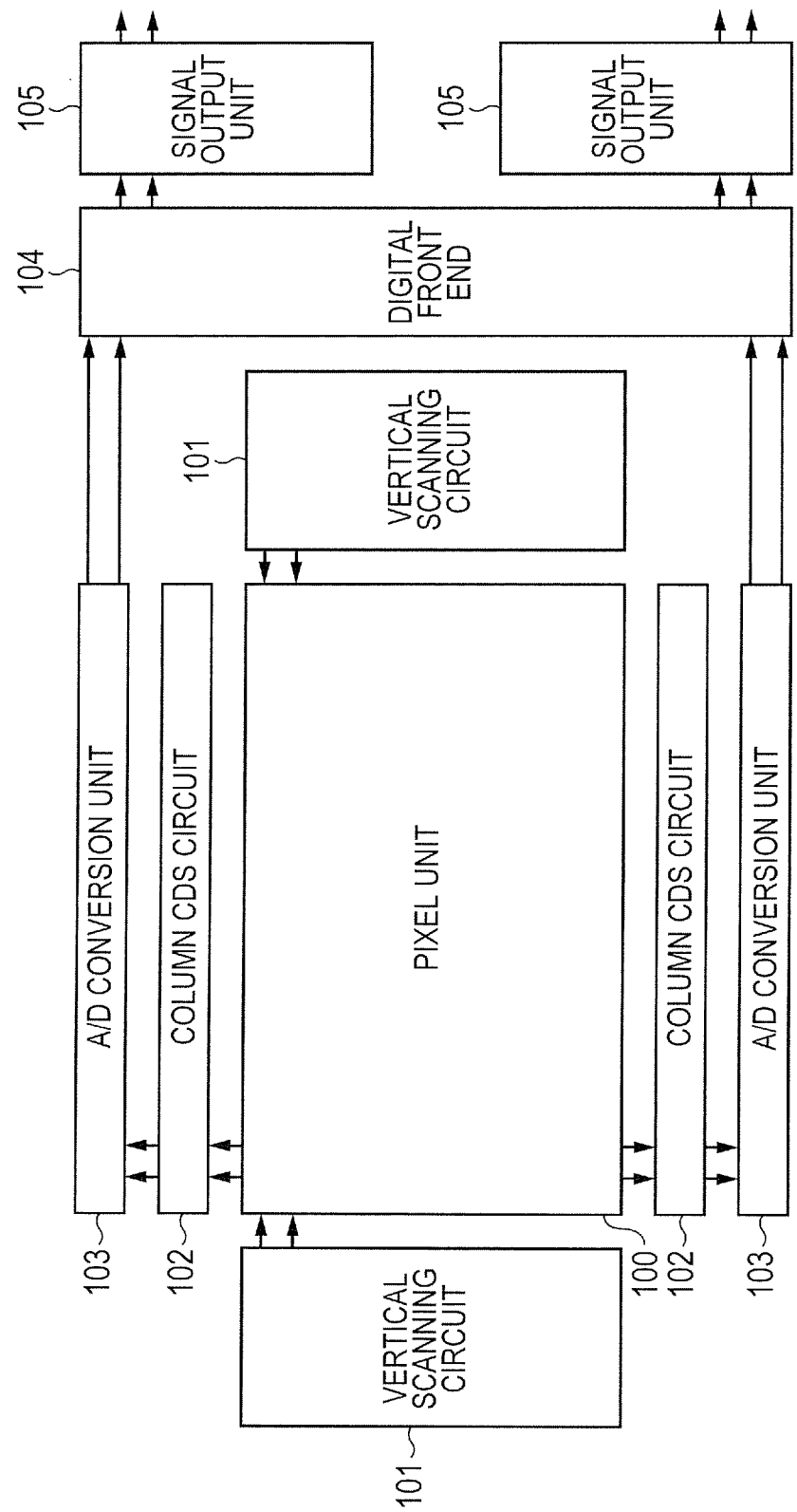
FIG. 1 is a block diagram of an imaging apparatus according to a first embodiment.

Preferred embodiments of the present invention will now be described in detail in accordance with the accompanying drawings. In the drawings of the embodiments, elements having the same functions are given the same reference signs, and repeated description may be omitted.

First Embodiment

FIG. 1 is a block diagram of an imaging apparatus according to a first embodiment of the present invention. The imaging apparatus includes a pixel unit 100, two vertical scanning circuits 101, and two column correlated double sampling (CDS) circuits 102. The pixel unit 100 is made up of a plurality of pixels arranged in matrix. According to a control signal provided from either of the two vertical scanning circuits 101, each pixel outputs a signal based on the quantity of light incident on the pixel to corresponding column CDS circuit 102 arranged above or below the pixel unit 100. The column CDS circuits 102 process the signal output from each pixel of the pixel unit 100, and sample an image signal based on incident light and a signal corresponding to noise.

The imaging apparatus further includes two analog-to-digital (A/D) conversion units 103, a digital front end (DFE) 104, and two signal output units 105. The output signals of the two column CDS circuits 102 are fed to the respective two A/D conversion units 103, and converted from analog to digital. The digital signals output from the A/D conversion units 103 undergo predetermined signal processing such as signal correction and rearrangement in the DFE 104, and are output from the respective signal output units 105.

As described above, the imaging apparatus in this embodiment includes two vertical scanning circuits 101, two column CDS circuits 102, two A/D conversion units 103, and two signal output units 105. This enables signal input/output to be performed simultaneously from both right and left of the pixel unit 100 or from above and below the pixel unit 100, thus improving the read rate. Note, however, that each of these blocks is not limited to two in number, and may be one or more than two in number.

In this embodiment, the blocks may be formed on the same chip, or on a plurality of chips. For example, the subsequent blocks of the column CDS circuits 102 may be formed on a separate chip.

Figure 2:
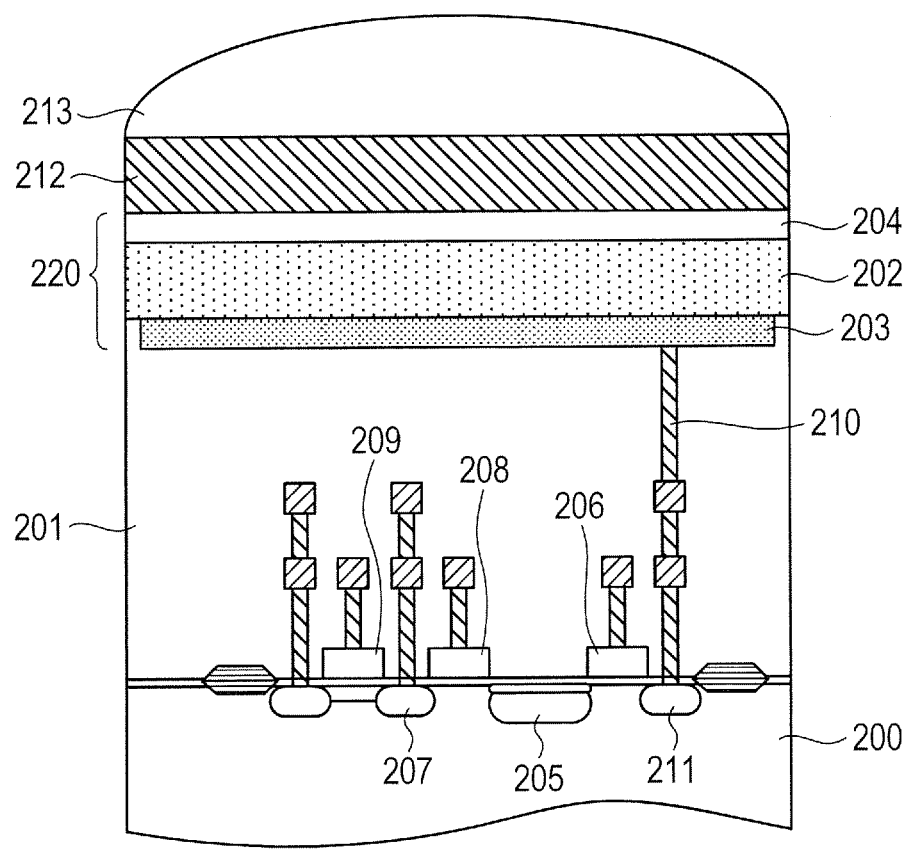
FIG. 2 is a sectional view of a pixel according to the first embodiment.

FIG. 2 is a sectional view of one of the plurality of pixels arranged in matrix in the pixel unit 100 illustrated in FIG. 1. The pixel includes a photoelectric conversion unit 220 disposed above and apart from a substrate 200 with an interlayer insulating layer 201 therebetween. A color filter 212 and a microlens 213 are disposed on the photoelectric conversion unit 220. The substrate 200 is an n-type silicon substrate with a p well being formed near its surface. The conductivity type (p-type or n-type) of semiconductor described in this specification is an example, and may be changed as appropriate. For example, the conductivity type may be all reversed.

The interlayer insulating layer 201 is a film for insulation between the substrate 200 and wiring, between separate pieces of wiring, etc. The interlayer insulating layer 201 may be formed, for example, using an insulator material such as boron phosphorus silicon glass (BPSG). The color filter 212 is made of a material having wavelength selectivity (color) to the transmittance of incident light. For example, color filters 212 of three colors red, green, and blue may be arranged by a predetermined rule to provide an imaging apparatus capable of color imaging. In the case where the imaging apparatus is a monochrome light sensor, the color filter 212 may be omitted. The microlens 213 is a lens for focusing incident light on the photoelectric conversion unit 220.

The photoelectric conversion unit 220 includes a photoelectric conversion layer 202 formed above a lower electrode 203, and an upper electrode 204 formed above the photoelectric conversion layer 202. In other words, the upper electrode 204 is positioned to overlap the substrate 200, and the lower electrode 203 is provided between the upper electrode 204 and the substrate 200. The photoelectric conversion layer 202 is interposed between the upper electrode 204 and the lower electrode 203. The photoelectric conversion layer 202 is a layer made of a photoelectric conversion material that generates a charge corresponding to the quantity of incident light. For example, a quantum dot film may be used for the photoelectric conversion layer 202. Since incident light needs to be incident on the photoelectric conversion layer 202, the upper electrode 204 is made of a conductive material such as indium tin oxide (ITO) transparent to incident light (e.g. visible light). The upper electrode 204 may be common to the plurality of pixels in the pixel unit 100, or provided separately for each pixel row or separately for each pixel. The lower electrode 203 is provided separately for each pixel, and made of a conductive material which is non-transparent (e.g. aluminum) or transparent (e.g. ITO).

The pixel has a first charge accumulating unit 205 and a second charge accumulating unit 207 in the substrate. The first charge accumulating unit 205 and the second charge accumulating unit 207 include an n-type impurity layer, and temporarily hold a charge generated in the photoelectric conversion unit 220.

The lower electrode 203 of the photoelectric conversion unit 220 is electrically connected to an n-type impurity layer 211 in the substrate 200, via a contact wiring 210 made of a conductor such as metal. The n-type impurity layer 211 is connected to the first charge accumulating unit 205 via a first transfer gate electrode 206. The first charge accumulating unit 205 is connected to the second charge accumulating unit 207 via a second transfer gate electrode 208. Each transistor is a metal oxide semiconductor field effect transistor (MOSFET) having a control electrode (gate) and first and second main electrodes (source, drain). In detail, the first transfer gate electrode 206, the n-type impurity layer 211, and the first charge accumulating unit 205 constitute a first transistor, and the second transfer gate electrode 208, the first charge accumulating unit 205, and the second charge accumulating unit 207 constitute a second transistor. Each transistor is controlled to be on (connected) or off (disconnected) according to the gate voltage.

In the structure described above, the photoelectric conversion unit 220 and the n-type impurity layer 211 are connected via the conductive contact wiring 210. Accordingly, the charge in the photoelectric conversion unit 220 cannot be fully transferred from the n-type impurity layer 211 to the first charge accumulating unit 205. This may cause kTC noise when turning off the first transfer gate electrode 206.

Here, the first charge accumulating unit 205 is a buried type charge accumulating unit with a p-type impurity layer provided on the surface of an n-type impurity layer. This structure prevents the first charge accumulating unit 205 from noise contamination caused by dark current generated on the substrate surface, and thus improves the signal-to-noise (S/N) ratio as compared with the case where the first charge accumulating unit 205 is not the buried type. Moreover, the first charge accumulating unit 205 can be fully depleted by adjusting the impurity concentration. This enables full charge transfer from the first charge accumulating unit 205 to the second charge accumulating unit 207.

The second charge accumulating unit 207 is connected to a reset transistor 209. When the reset transistor 209 is turned on, a reset voltage VRES is applied to the second charge accumulating unit 207, to reset the charge accumulated in the second charge accumulating unit 207. The second charge accumulating unit 207 is provided with an amplifying transistor (not illustrated) for outputting the signal corresponding to the accumulated charge. The amplifying transistor is included in an amplifying unit.

Figure 3A:
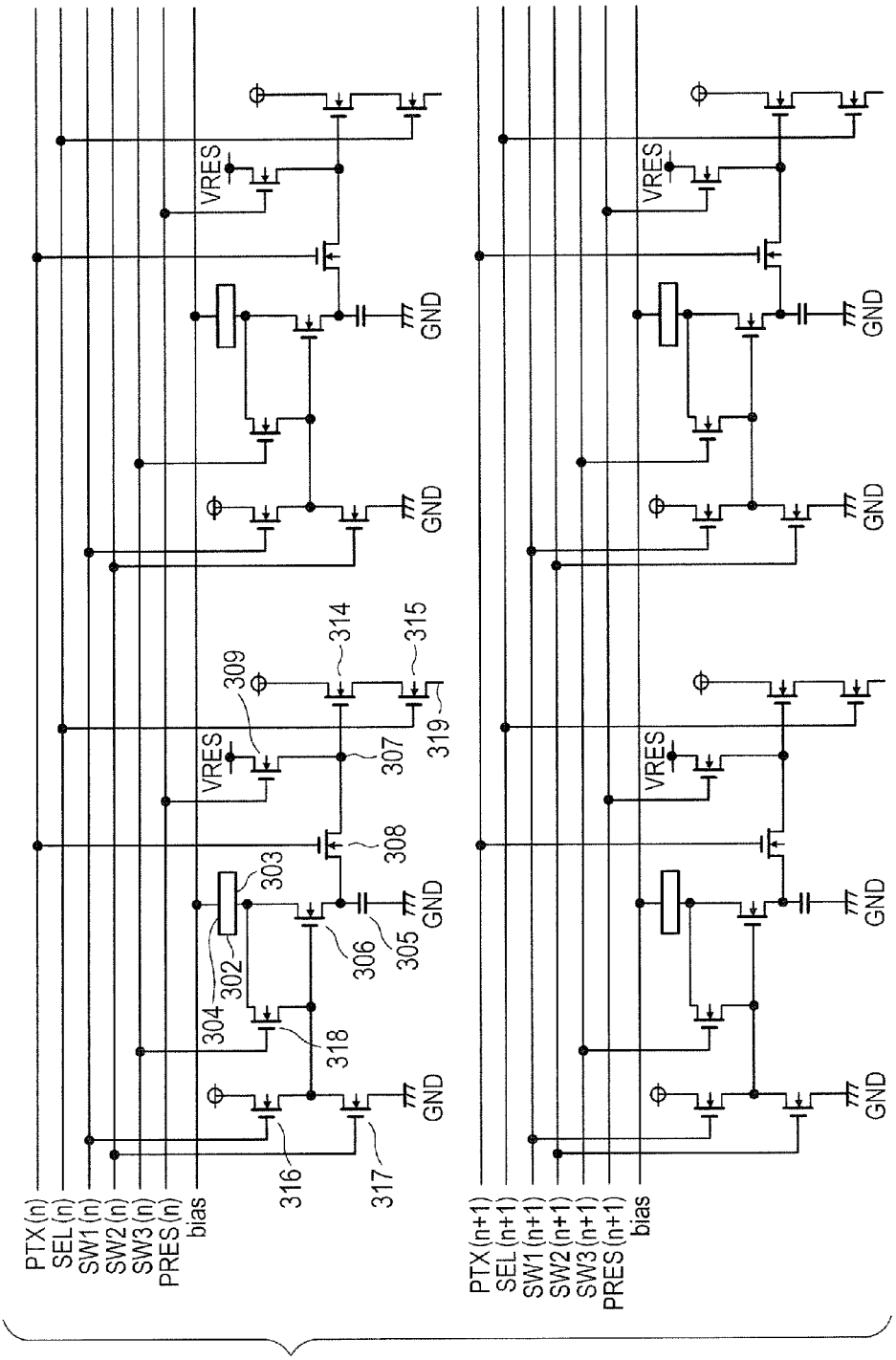
FIG. 3A is a circuit diagram of pixels according to the first embodiment.

FIG. 3A is a circuit diagram of pixels of 2 rows×2 columns. Hereafter, the upper and lower rows are respectively referred to as the n-th row and the (n+1)-th row, and the left and right columns respectively as the m-th column and the (m+1)-th column. A plurality of signal lines connected in common for each pixel row are also illustrated in FIG. 3A. The following describes the circuit structure with regard to the pixel of the n-th row and m-th column illustrated with reference signs.

FIG. 3A illustrates the circuit structure of a photoelectric conversion layer 302, a lower electrode 303, an upper electrode 304, a first charge accumulating unit 305, a transfer transistor 306, a second charge accumulating unit 307, a charge transfer transistor 308, and a reset transistor 309 as mentioned above. The photoelectric conversion layer 302 corresponds to the photoelectric conversion layer 202 in FIG. 2. The lower electrode 303 corresponds to the lower electrode 203 in FIG. 2. The upper electrode 304 corresponds to the upper electrode 204 in FIG. 2. The first charge accumulating unit 305 corresponds to the first charge accumulating unit 205 in FIG. 2. The transfer transistor 306 corresponds to the above-mentioned first transistor, and includes the first transfer gate electrode 206, the first charge accumulating unit 205, and the second charge accumulating unit 207 in FIG. 2. The second charge accumulating unit 307 corresponds to the second charge accumulating unit 207 in FIG. 2. The charge transfer transistor 308 corresponds to the above-mentioned second transistor, and includes the second transfer gate electrode 208, the first charge accumulating unit 205, and the second charge accumulating unit 207 in FIG. 2. The reset transistor 309 corresponds to the reset transistor 209 in FIG. 2. The connection relations between these elements are the same as those described with reference to FIG. 2, and so their description is omitted. A control signal PTX(n) is applied to the gate of the charge transfer transistor 308, and a control signal PRES(n) is applied to the gate of the reset transistor 309. The index indicates that the control signal corresponds to the n-th pixel row. The upper electrode 304 is connected to wiring for supplying, as a control signal "bias", a bias voltage necessary to generate a charge by photoelectric conversion.

Each pixel further includes an amplifying transistor 314, a row select transistor 315, a first control transistor 316, a second control transistor 317, and a third control transistor 318. The gate of the amplifying transistor 314 is connected to the second charge accumulating unit 307. A power supply voltage is applied to the drain of the amplifying transistor 314, and the source of the amplifying transistor 314 is connected to the drain of the row select transistor 315. A control signal SEL(n) is applied to the gate of the row select transistor 315. The source of the row select transistor 315 is connected to the column CDS circuit 102 via a vertical output line 319. Hence, when the row select transistor 315 is on, the voltage signal corresponding to the amount of charge accumulated in the second charge accumulating unit 307 is output to the vertical output line 319.

The transfer transistor 306 is connected to the first control transistor 316, the second control transistor 317, and the third control transistor 318 as switching means for controlling the gate voltage.

The power supply voltage is applied to the drain of the first control transistor 316, and the source of the first control transistor 316 is connected to the gate of the transfer transistor 306. A control signal SW1(n) is applied to the gate of the first control transistor 316. When the first control transistor 316 is turned on, the power supply voltage is supplied to the gate of the transfer transistor 306, and the transfer transistor 306 is turned on. In other words, the first control transistor 316 switches connection and disconnection between the control electrode of the transfer transistor 306 and the node supplied with the power supply voltage.

The drain of the second control transistor 317 is connected to the gate of the transfer transistor 306, and the source of the second control transistor 317 is connected to a ground (GND) potential. A control signal SW2(n) is applied to the gate of the second control transistor 317. When the second control transistor 317 is turned on, the GND potential is supplied to the gate of the transfer transistor 306, and the transfer transistor 306 is turned off. In other words, the second control transistor 317 switches connection and disconnection between the control electrode of the transfer transistor 306 and the node supplied with the ground voltage.

The drain of the third control transistor 318 is connected to the drain of the transfer transistor 306, and the source of the third control transistor 318 is connected to the gate of the transfer transistor 306. Thus, the third control transistor 318 switches connection and disconnection between the drain and gate of the transfer transistor 306. In another respect, the third control transistor 318 (switching unit) is placed in an electrical path between the drain and gate of the transfer transistor 306. A control signal SW3(n) is applied to the gate of the third control transistor 318. When the third control transistor 318 is turned on, the gate and drain of the transfer transistor 306 are connected, and the transfer transistor 306 operates in a subthreshold region.

In this embodiment, upon turning on and off the transfer transistor 306, the gate is connected respectively to the power supply and GND. Alternatively, a potential other than the power supply or GND may be supplied as long as it is a potential enabling the operation of switching the transfer transistor 306 on or off.

Figure 3B:
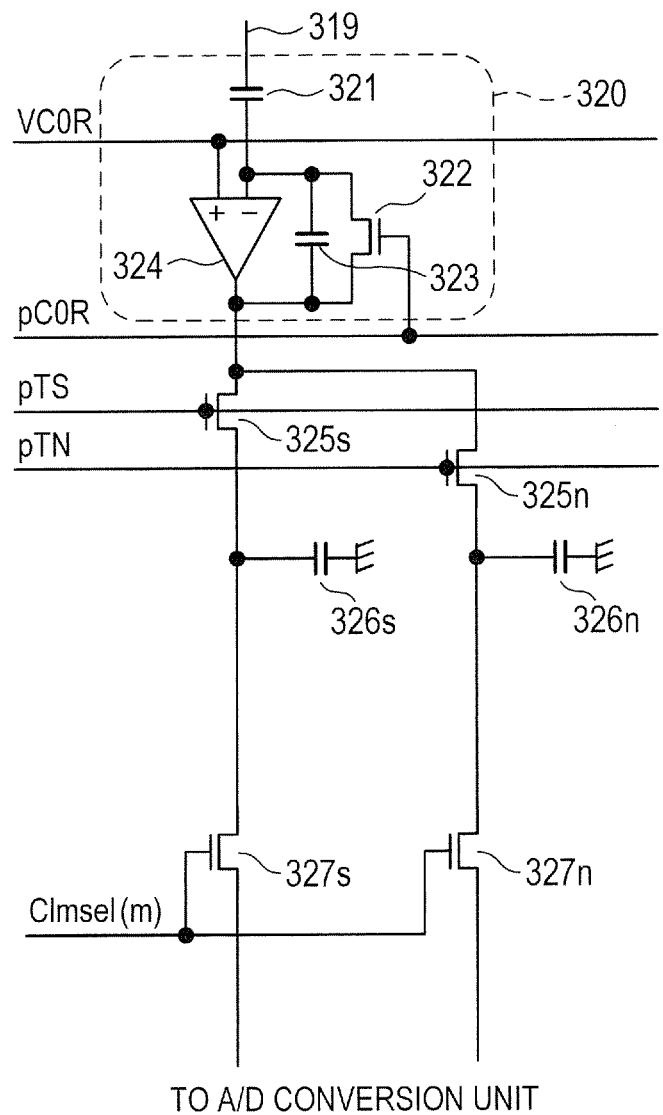
FIG. 3B is a circuit diagram of a column CDS circuit according to the first embodiment.

FIG. 3B is a circuit diagram of the column CDS circuit 102 of the m-th column. The column CDS circuit 102 includes a column amplifier 320, sample and hold transistors 325s and 325n, sample and hold capacitors 326s and 326n, and column select transistors 327s and 327n. The column amplifier 320 includes an input capacitor 321, an amplifier reset transistor 322, a feedback capacitor 323, and a differential amplifier 324.

The output signal from the pixel is fed to the inverting input terminal of the differential amplifier 324 via the vertical output line 319. The feedback capacitor 323 is connected between the inverting input terminal and output terminal of the differential amplifier 324, and the gain of the column amplifier 320 is determined by the capacitance ratio between the input capacitor 321 and the feedback capacitor 323. A plurality of feedback capacitors 323 may be provided to allow the gain to be switched. The source and drain of the amplifier reset transistor 322 are also connected to the inverting input terminal and output terminal of the differential amplifier 324. A control signal pC0R for controlling the on/off state is applied to the gate of the amplifier reset transistor 322. Turning on the amplifier reset transistor 322 can reset the charge accumulated in each capacitor, and turning off the amplifier reset transistor 322 can clamp the voltage applied to each capacitor. A reference voltage VC0R is applied to the non-inverting input terminal of the differential amplifier 324.

The output terminal of the differential amplifier 324 is connected to one of the source and drain of each of the sample and hold transistors 325s and 325n, and the other one of the source and drain of each of the sample and hold transistors 325s and 325n is connected to a corresponding one of the sample and hold capacitors 326s and 326n. Control signals pTS and pTN are applied respectively to the gates of the sample and hold transistors 325s and 325n. Thus, the output signal of the column amplifier 320 can be sampled and held in the sample and hold capacitors 326s and 326n. Of the output signal of the column amplifier 320, a signal component (hereafter referred to as an image signal) is held in the sample and hold capacitor 326s, and a noise component (hereafter referred to as a noise signal) is held in the sample and hold capacitor 326n. The sample and hold capacitors 326s and 326n are each connected to one of the source and drain of a corresponding one of the column select transistors 327s and 327n, and the other one of the source and drain of each of the column select transistors 327s and 327n is connected to the A/D conversion unit 103. A control signal Clmsel(m) is applied to the gates of the column select transistors 327s and 327n. With such a circuit structure, the column CDS circuit 102 samples the image signal and the noise signal from the signal received from the pixel unit 100, and outputs the image signal and the noise signal to the A/D conversion unit 103.

The signal from which noise is removed can be generated by obtaining the difference between the image signal and the noise signal. The process of obtaining the difference may be performed before A/D conversion by adding an arithmetic circuit in an preceding stage of an A/D converter included in the A/D conversion unit 103, or performed by arithmetic processing on digital data after A/D conversion. Alternatively, a circuit for obtaining the difference may be added to the column CDS circuit 102 so that the difference between the image signal and the noise signal is obtained in the column CDS circuit 102 and output to the A/D conversion unit 103.

FIG. 4 is a drive timing chart of the imaging apparatus in this embodiment. The operation in the k-th frame and the (k+1)-th frame for the pixels of the n-th row and (n+1)-th row out of the pixels arranged in matrix is illustrated in the timing chart in FIG. 4. The following describes the operation of the n-th pixel from starting the accumulation of charge to signal reading for obtaining the signal of the (k+1)-th frame. It is assumed here that each transistor is on when the input control signal is high, and off when the input control signal is low.

Before time t1, the control signal SEL(n) is high, and the n-th pixel row is in the selected state. At time t1, the control signals SW1(n) and PRES(n) become high, to turn on the first control transistor 316 and the reset transistor 309. As a result, a voltage of high level is applied to the gate of the transfer transistor 306, to turn on the transfer transistor 306.

At time t2, the control signal PTX(n) becomes high, to turn on the charge transfer transistor 308. As a result, the first charge accumulating unit 305, the second charge accumulating unit 307, and the photoelectric conversion layer 302 are reset.

At time t3, the control signal PTX(n) becomes low, to turn off the charge transfer transistor 308. With this timing, the accumulation of a charge generated from incident light on the photoelectric conversion layer 302 starts. The charge generated in the photoelectric conversion layer 302 is accumulated in the first charge accumulating unit 305 via the transfer transistor 306 which is on.

At time t4, the control signal SW1(n) becomes low and the control signal SW3(n) becomes high, to turn off the first control transistor 316 and turn on the third control transistor 318. As a result, the gate and drain of the transfer transistor 306 are at the same potential. In this state, the transfer transistor 306 operates in the subthreshold region.

Subsequently, at time t5, the control signal SW2(n) becomes high and the control signal SW3(n) becomes low, to turn on the second control transistor 317 and turn off the third control transistor 318. This turns off the transfer transistor 306, so that the flow of charge from the photoelectric conversion layer 302 into the first charge accumulating unit 305 stops and the charge accumulation ends.

In the case where the gate potential of the transfer transistor 306 changes from high to low in a short time, typically the source potential and the drain potential do not match at the timing of switching from on to off, and accordingly kTC noise may occur as mentioned earlier. In this embodiment, however, the transfer transistor 306 operates in the subthreshold region during the period from time t4 to time t5. The transfer transistor 306 is therefore switched from on to off through the state of the subthreshold region in which the gate and the drain are kept at the same potential. This reduces kTC noise which occurs when the transfer transistor 306 is switched from on to off.

From time t6 is a period for reading the signal to the column CDS circuit 102 for each row in sequence. At time t6, the noise signal is read to the column CDS circuit 102, and held in the sample and hold capacitor 326n.

At time t7, the control signal PTX(n) becomes high, to turn on the charge transfer transistor 308. As a result, the signal charge accumulated in the first charge accumulating unit 305 is transferred to the second charge accumulating unit 307.

At time t8, the image signal is read to the column CDS circuit 102, and held in the sample and hold capacitor 326s. The column CDS circuit 102 then outputs the noise signal and the image signal to the A/D conversion unit 103. The noise signal and the image signal are converted to digital signals in the A/D conversion unit 103 and processed in the DFE 104, and then output from the signal output unit 105 in sequence.

At time t9 after the reading of the image signal ends, the control signals SW1(n) and PRES(n) become high, to turn on the transfer transistor 306 and the reset transistor 309. Subsequently, at time t10, the control signal PTX(n) becomes high, to turn on the charge transfer transistor 308. As a result, the first charge accumulating unit 305, the second charge accumulating unit 307, and the photoelectric conversion layer 302 are reset.

At time t11, the control signal PTX(n) becomes low, to turn off the charge transfer transistor 308. With this timing, the accumulation of a signal for the (k+2)-th frame starts. The same operation is repeated for the (n+1)-th and subsequent rows, with a predetermined time difference from the n-th row. In this way, the signal is read from each pixel in the pixel unit 100.

As described above, the period during which the gate voltage and drain voltage of the transfer transistor 306 are kept at the same potential is provided when transferring the signal from the photoelectric conversion layer 302 to the first charge accumulating unit 305 in this embodiment. This reduces kTC noise which occurs when turning off the transfer transistor 306, and improves the S/N ratio of the output signal.

Figure 5:
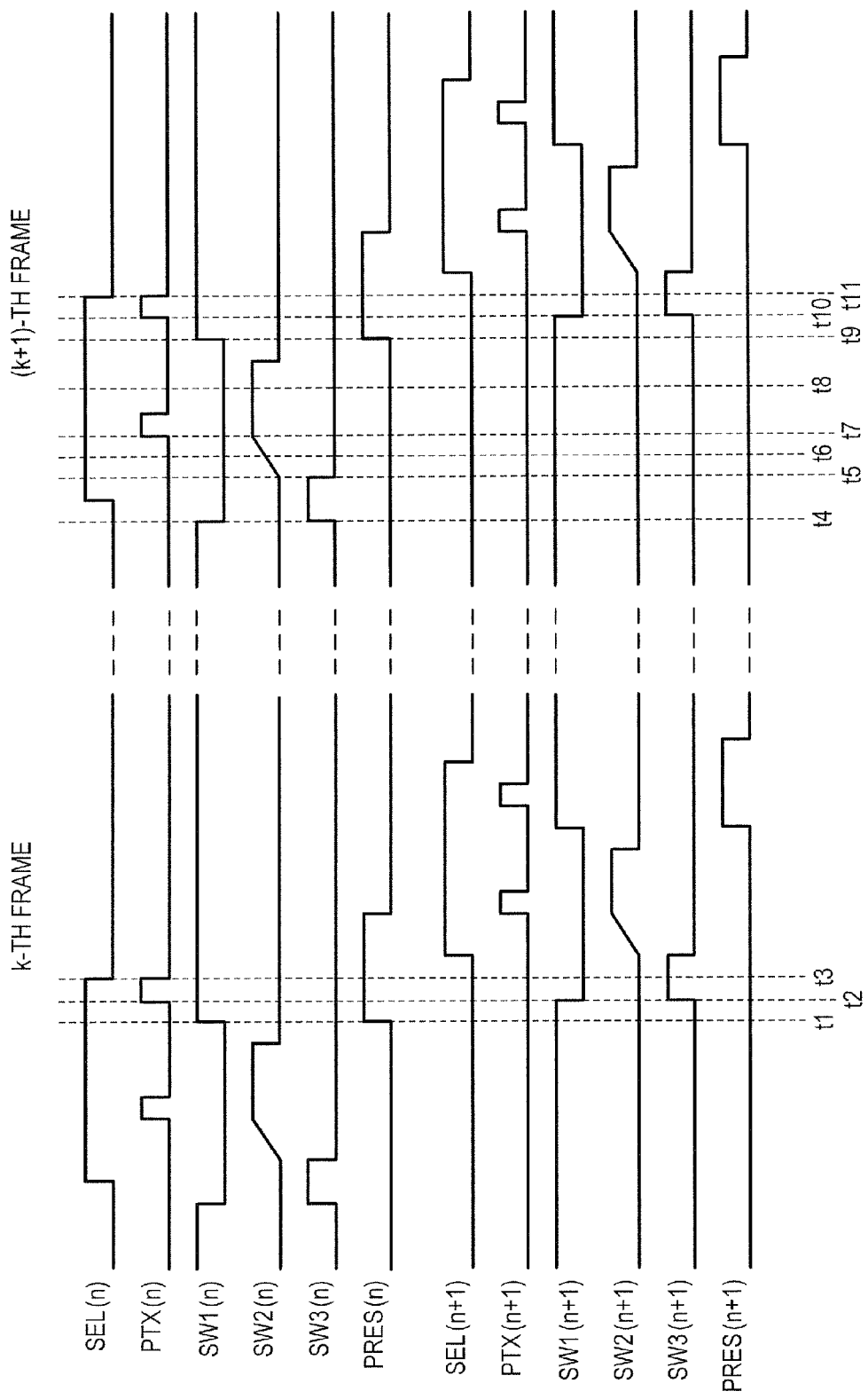
FIG. 5 is a drive timing chart of an imaging apparatus according to a modification of the first embodiment.

FIG. 5 is a drive timing chart according to a modification of the embodiment. This modification differs from the drive timing chart in FIG. 4 in that the voltage of the control signal SW2(n) gradually changes from low to high in the period from t5 to t7. Thus, the second control transistor 317 gradually changes from off to on, so that the gate voltage of the transfer transistor 306 changes more slowly. The kTC noise reduction effect can be improved in this way. Though FIG. 5 illustrates the voltage change of SW2(n) as being linear with respect to time, the voltage change is not limited to linear and may have any waveform in which SW2(n) gradually changes from low to high.

Second Embodiment

A second embodiment differs from the first embodiment in the structure of the photoelectric conversion unit 220.

According to the second embodiment, an electronic shutter operation by any of a global shutter and a rolling shutter can be realized.

Figure 6:
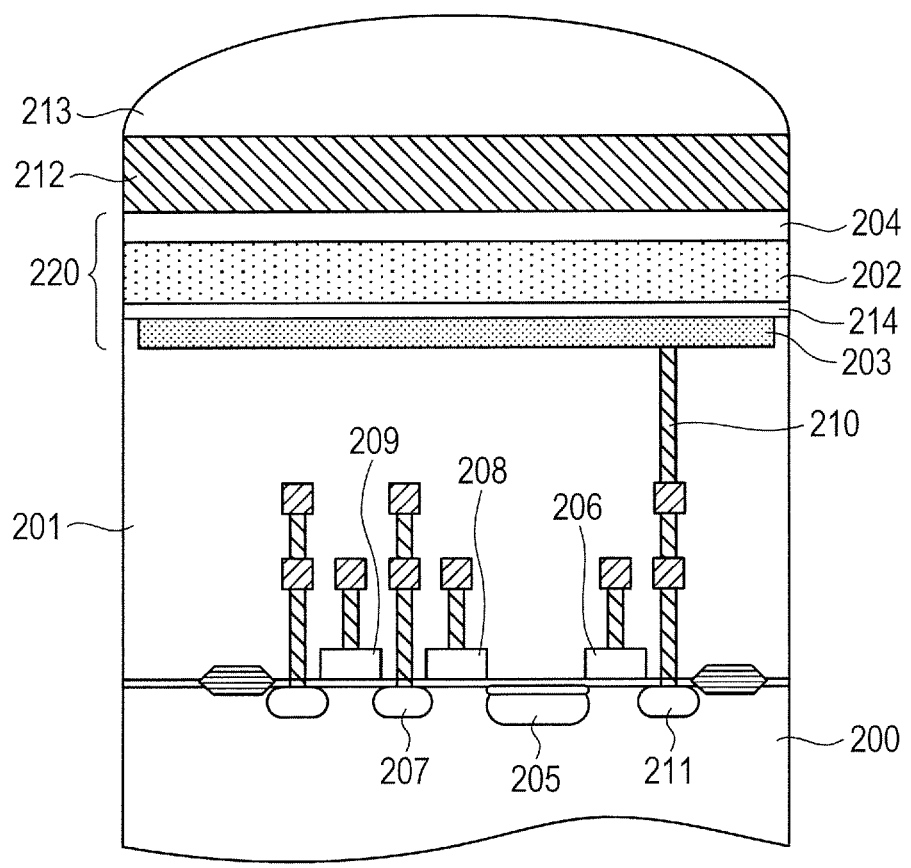
FIG. 6 is a sectional view of a pixel according to a second embodiment.

FIG. 6 is a sectional view of a pixel in the second embodiment. The difference from the first embodiment lies in that an insulation layer 214 for electrical insulation between the lower electrode and the photoelectric conversion layer is provided between the photoelectric conversion layer 202 and the lower electrode 203. The insulation layer 214 is made of silicon oxide, as an example. The other structures are the same as those in the first embodiment.

In the first embodiment, the photoelectric conversion layer 202 and the lower electrode 203 made of a conductor such as metal are connected. Accordingly, even when the potential of the photoelectric conversion layer 202 is changed, carriers in the lower electrode 203 may flow into the photoelectric conversion layer 202, and therefore the photoelectric conversion layer 202 is not depleted. In this embodiment, on the other hand, the insulation layer 214 is provided between the photoelectric conversion layer 202 and the lower electrode 203, so that carriers in the lower electrode 203 do not move into the photoelectric conversion layer 202. Hence, the photoelectric conversion layer 202 can be fully depleted by fully discharging the charge. Moreover, since the photoelectric conversion unit 220 functions equivalently as a capacitor, the charge generated by photoelectric conversion can be accumulated therein.

In this embodiment, a first voltage or a second voltage is applied to the upper electrode 204. In the case where the first voltage is applied to the upper electrode 204, the charge generated in the photoelectric conversion layer 202 is held therein. In the case where the second voltage is applied to the upper electrode 204, the charge held in the photoelectric conversion layer 202 is fully discharged to the upper electrode 204. Thus, the photoelectric conversion layer 202 can be switched between two states, i.e. the full depletion state of fully discharging the charge and the accumulation state of accumulating the charge corresponding to the incident light inside, according to the voltage applied to the upper electrode.

In this embodiment, the first voltage is a signal of high level, and the second voltage is a signal of low level. The applied signal is referred to as a control signal "bias". Alternatively, the first voltage may be a signal of low level, and the second voltage a signal of high level.

The photoelectric conversion layer 202 is thus capable of full depletion. However, the photoelectric conversion unit 220 and the n-type impurity layer 211 are connected via the contact wiring 210, as in the first embodiment. Accordingly, the charge in the photoelectric conversion unit 220 cannot be fully transferred from the n-type impurity layer 211 to the first charge accumulating unit 205. This may cause kTC noise when turning off the first transfer gate electrode 206.

The photoelectric conversion unit 220 in this embodiment can hold the charge in the photoelectric conversion layer 202. This enables the global shutter operation. The rolling shutter operation is also enabled by changing the operation timing. The following describes the global shutter and the rolling shutter, respectively with reference to timing charts in FIGS. 7 and 8.

Figure 7:
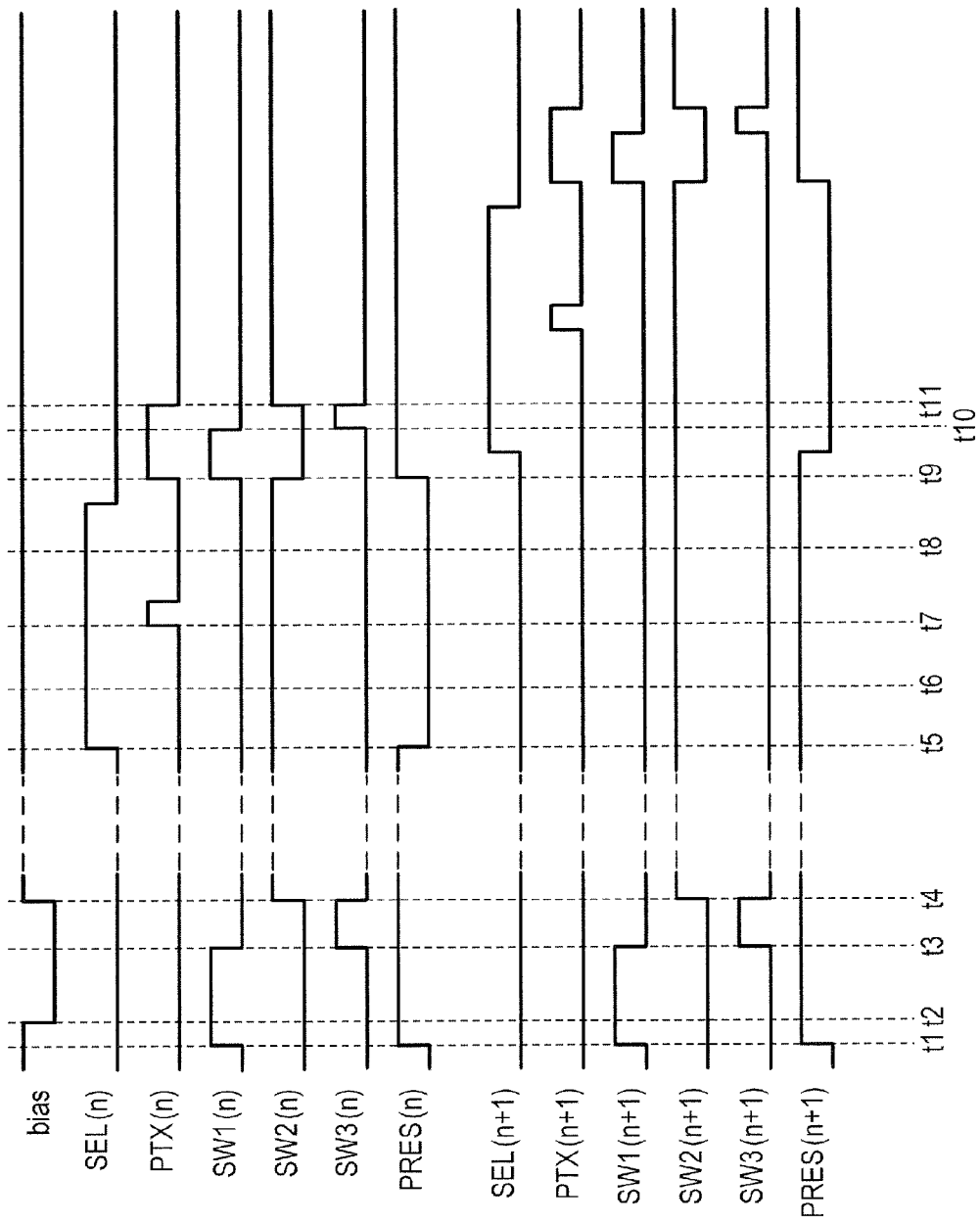
FIG. 7 is a drive timing chart of a global shutter according to the second embodiment.

FIG. 7 is a drive timing chart of the global shutter in the second embodiment. The circuit diagram in this embodiment is the same as that in FIG. 3A, and the global shutter operation is described below with reference to FIG. 3A. The drive pattern in FIG. 7 indicates the drive operation for the n-th row and the (n+1)-th row in the k-th frame.

In an initial state before time t1, the control signal "bias" is high, and the other control signals are low. At time t1, the control signals SW1(n) and SW1(n+1) become high, to turn on the transfer transistor 306. In addition, the control signals PRES(n) and PRES(n+1) become high, to turn on the reset transistor 309. As a result, the potential of the second charge accumulating unit 307 is reset.

At time t2, the control signal "bias" becomes low, to discharge the charge accumulated in the photoelectric conversion layer 302 to the upper electrode 304. Here, the photoelectric conversion layer 302 is fully depleted, and the potential of the lower electrode 303 varies depending on the amount of charge discharged.

At time t3, the control signals SW1(n) and SW1(n+1) become low, and the control signals SW3(n) and SW3(n+1) become high. As a result, the gate and drain of the transfer transistor 306 are at the same potential.

At time t4, the control signals SW3(n) and SW3(n+1) become low, and the control signals SW2(n) and SW2(n+1) become high. This turns off the transfer transistor 306, and the signal transfer from the photoelectric conversion layer 302 to the first charge accumulating unit 305 is completed. The signal corresponding to the charge accumulated in the photoelectric conversion layer 302 is accumulated in the first charge accumulating unit 305. kTC noise which occurs upon signal transfer can be reduced as the transfer transistor 306 operates in the subthreshold region during the period from time t3 to time t4, as in the first embodiment.

At time t4, the control signal "bias" becomes high, to put the photoelectric conversion layer 302 again in the accumulation state of accumulating the charge corresponding to the incident light. The photoelectric conversion layer 302 thus starts signal accumulation for the (k+1)-th frame.

Though the operation of the n-th row and the (n+1)-th row is illustrated in FIG. 7, the operation is performed simultaneously in all rows. In detail, from time t2 to time t4, the signal transfer to the first charge accumulating unit 305 is performed simultaneously in all rows. Moreover, from time t4, the charge accumulation in the photoelectric conversion layer 302 is started simultaneously in all rows. This structure enables the global shutter operation.

From time t5 is a period for reading the signal held in the first charge accumulating unit 305 for each row in sequence. At time t5, the control signal SEL(n) becomes high, to select the n-th row. In addition, at time t5, the control signal PRES(n) becomes low, to clear the reset state of the second charge accumulating unit 307. At time t6, the noise signal is read to the column CDS circuit 102. At time t7, the control signal PTX(n) becomes high, to turn on the charge transfer transistor 308. As a result, the signal charge is transferred from the first charge accumulating unit 305 to the second charge accumulating unit 307. At time t8, the image signal is read to the column CDS circuit 102. The image signal and the noise signal are then output from the column CDS circuit 102 to the A/D conversion unit 103. The image signal and noise signal converted into digital signals are processed in the DFE 104, and then output from the signal output unit 105 in sequence.

At time t9 after the signal reading from the first charge accumulating unit 305 is completed, the control signals SW1(n), PTX(n), and PRES(n) become high. As a result, the lower electrode 303, the first charge accumulating unit 305, and the second charge accumulating unit 307 are reset. In the period from time t10 to time t1*l* before the reset state is cleared, the gate and drain of the transfer transistor are kept at the same potential to thereby reduce kTC noise which occurs upon reset.

The signal reading operation from time t5 described above is for the n-th pixel row. The same operation is repeated for the (n+1)-th and subsequent pixel rows in sequence. In this way, the image signal is read from the pixel unit 100.

Here, the control signal SW2(n) may be gradually changed from low to high, as in the modification of the first embodiment.

Figure 8:
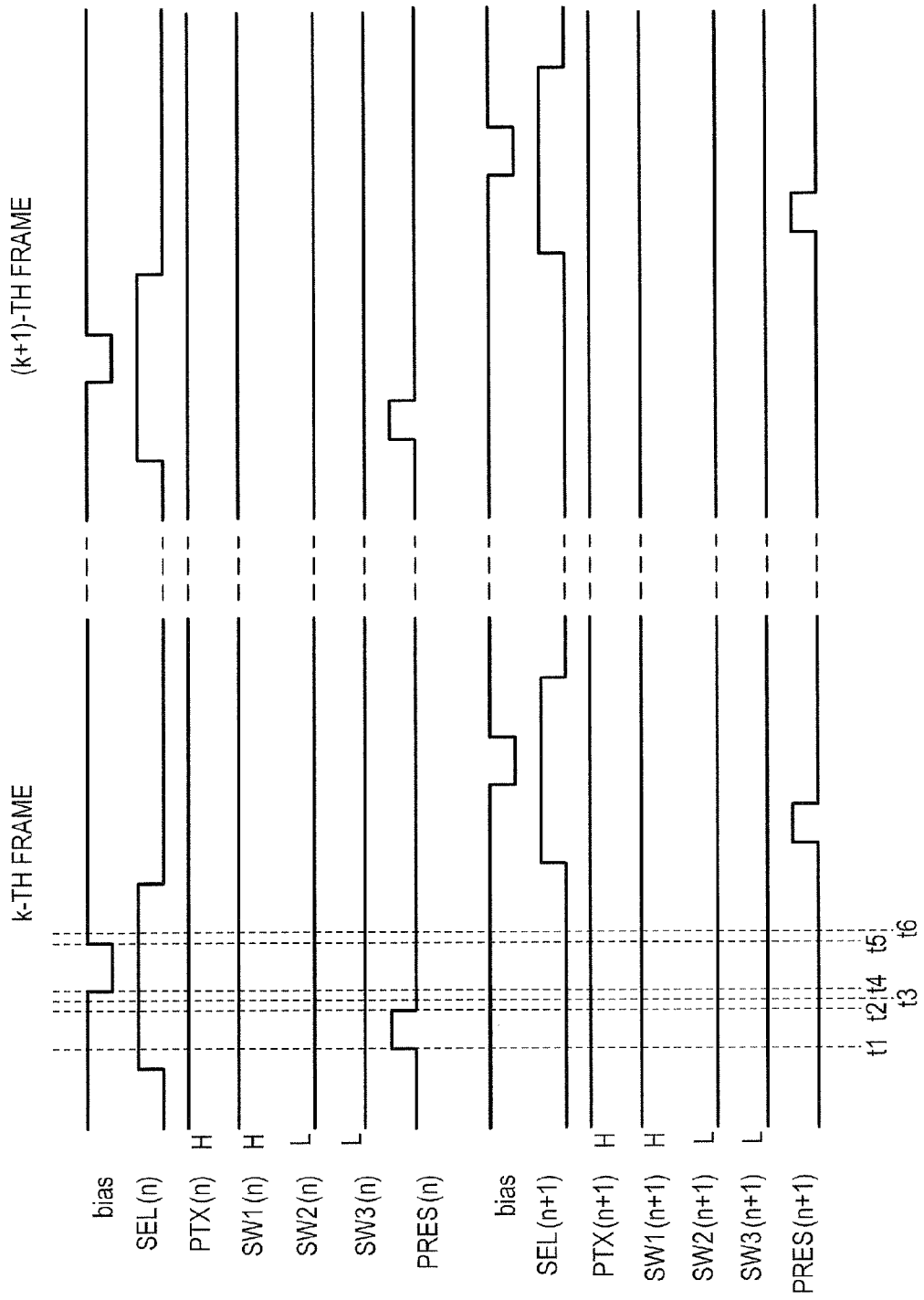
FIG. 8 is a drive timing chart of a rolling shutter according to the second embodiment.

The following describes the rolling shutter operation. FIG. 8 is a drive timing chart of the rolling shutter in the second embodiment. Though the circuit structure is the same as that of the global shutter, the upper electrode 304 needs to be provided separately for each pixel or in common for each row to enable a separate potential to be supplied for each row, in order to realize the rolling shutter operation.

FIG. 8 is a diagram illustrating the operation for the n-th row and the (n+1)-th row in the k-th frame and the (k+1)-th frame. In the rolling shutter operation, the transfer transistor 306 is constantly in the connected state. In detail, the control signal SW1(n) is constantly high, and the control signals SW2(n) and SW3(n) are constantly low. The control signal PTX(n) is constantly high, so that the charge transfer transistor 308 is in the connected state, too.

At time t1, the control signal PRES(n) becomes high, to reset the potentials of the first charge accumulating unit 305, second charge accumulating unit 307, and lower electrode 303.

At time t2, the control signal PRES(n) becomes low, to turn off the reset transistor 309. Here, kTC noise occurs in the second charge accumulating unit 307, as a result of the reset transistor 309 being turned off. Meanwhile, the photoelectric conversion layer 302 is in the accumulation state, and keeps holding the signal charge of the n-th row.

At time t3, the noise signal including kTC noise is read to the column CDS circuit 102.

At time t4, the control signal "bias" becomes low, so that the charge accumulated in the photoelectric conversion layer 302 is discharged to the upper electrode 304. As a result, the photoelectric conversion layer 302 is fully depleted. Here, the voltage signal corresponding to the amount of charge discharged is induced in the first charge accumulating unit 305 and the second charge accumulating unit 307. At time t5, the control signal "bias" becomes high. As a result, the photoelectric conversion layer 302 returns to the accumulation state, to start the accumulation for the (k+1)-th frame.

At time t6, the image signal is read to the column CDS circuit 102. After this, the image signal and the noise signal are output from the column CDS circuit 102 to the A/D conversion unit 103. The image signal and noise signal converted into digital signals are processed in the DFE 104, and then output from the signal output unit 105 in sequence. The same operation is repeated for the (n+1)-th and subsequent rows. The signal of each row in the pixel unit 100 is read in this way.

kTC noise which occurs as a result of turning off the reset transistor 309 can be removed or reduced by obtaining the difference between the image signal and the noise signal that are read as above-mentioned manner.

As described above, in the imaging apparatus in this embodiment, not only the same advantageous effects as in the first embodiment can be attained, but also both the global shutter operation and the rolling shutter operation can be realized by changing the drive timing. Thus, switching between the global shutter and the rolling shutter is enabled in this embodiment.

Figure 9:
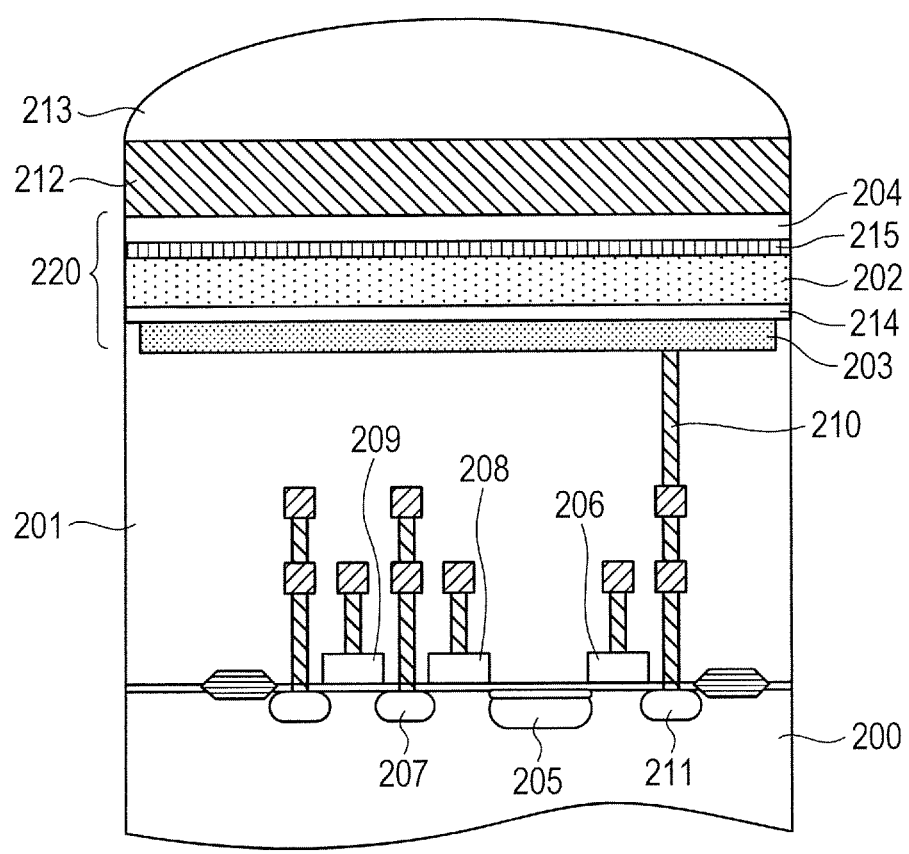
FIG. 9 is a sectional view of a pixel according to a modification of the second embodiment.

FIG. 9 is a sectional view of a pixel according to a modification of this embodiment. The pixel in this modification further includes a blocking layer 215 between the photoelectric conversion layer 202 and the upper electrode 204. The blocking layer 215 is a layer for blocking the movement of charge between the upper electrode 304 and the photoelectric conversion layer 302 during the accumulating period. As an example, the blocking layer 215 is an n-type semiconductor layer in the case where a positive charge is accumulated in the photoelectric conversion layer 302.

Third Embodiment

Figure 10:
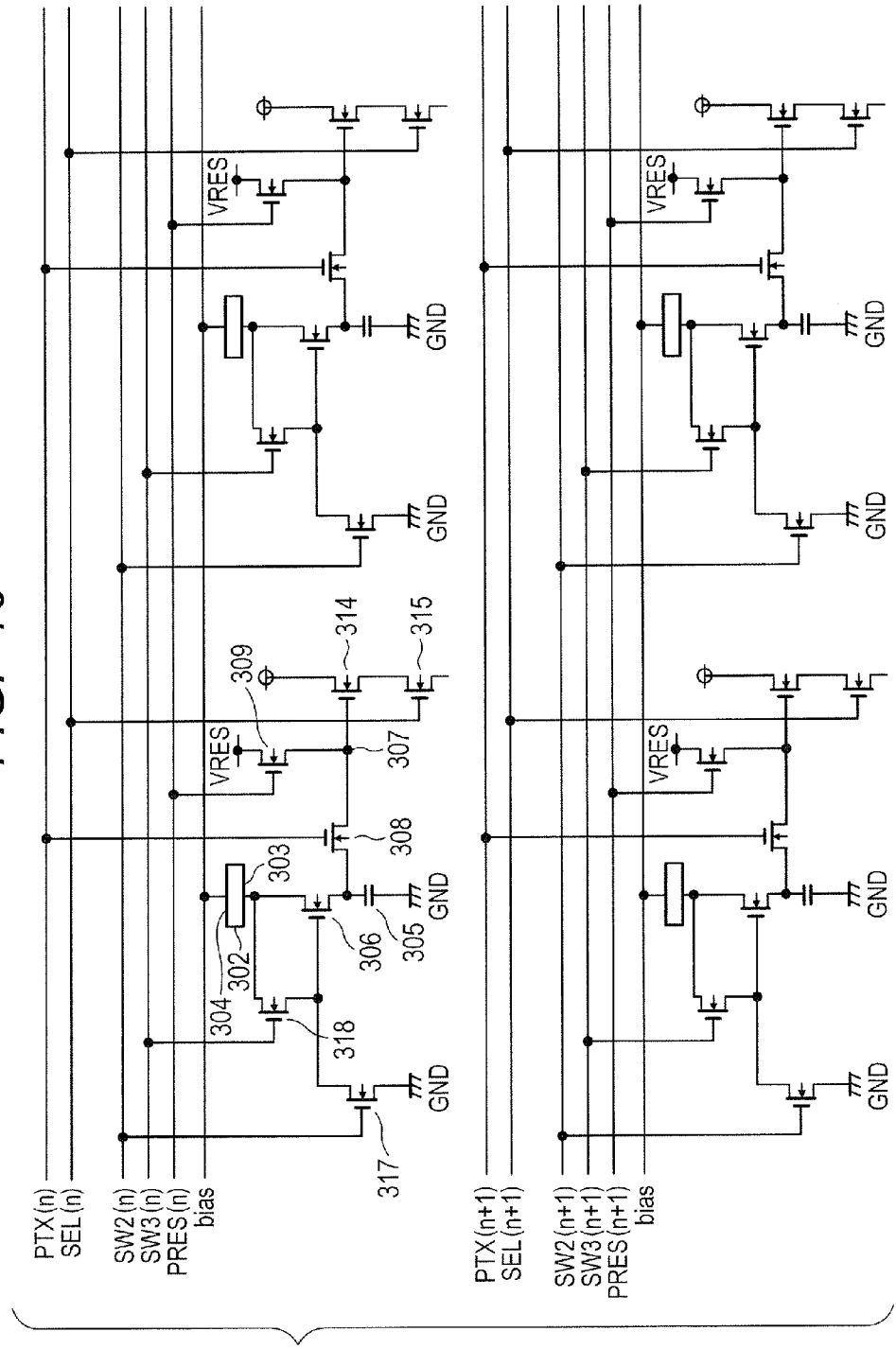
FIG. 10 is a circuit diagram of pixels according to a third embodiment.
Figure 11:
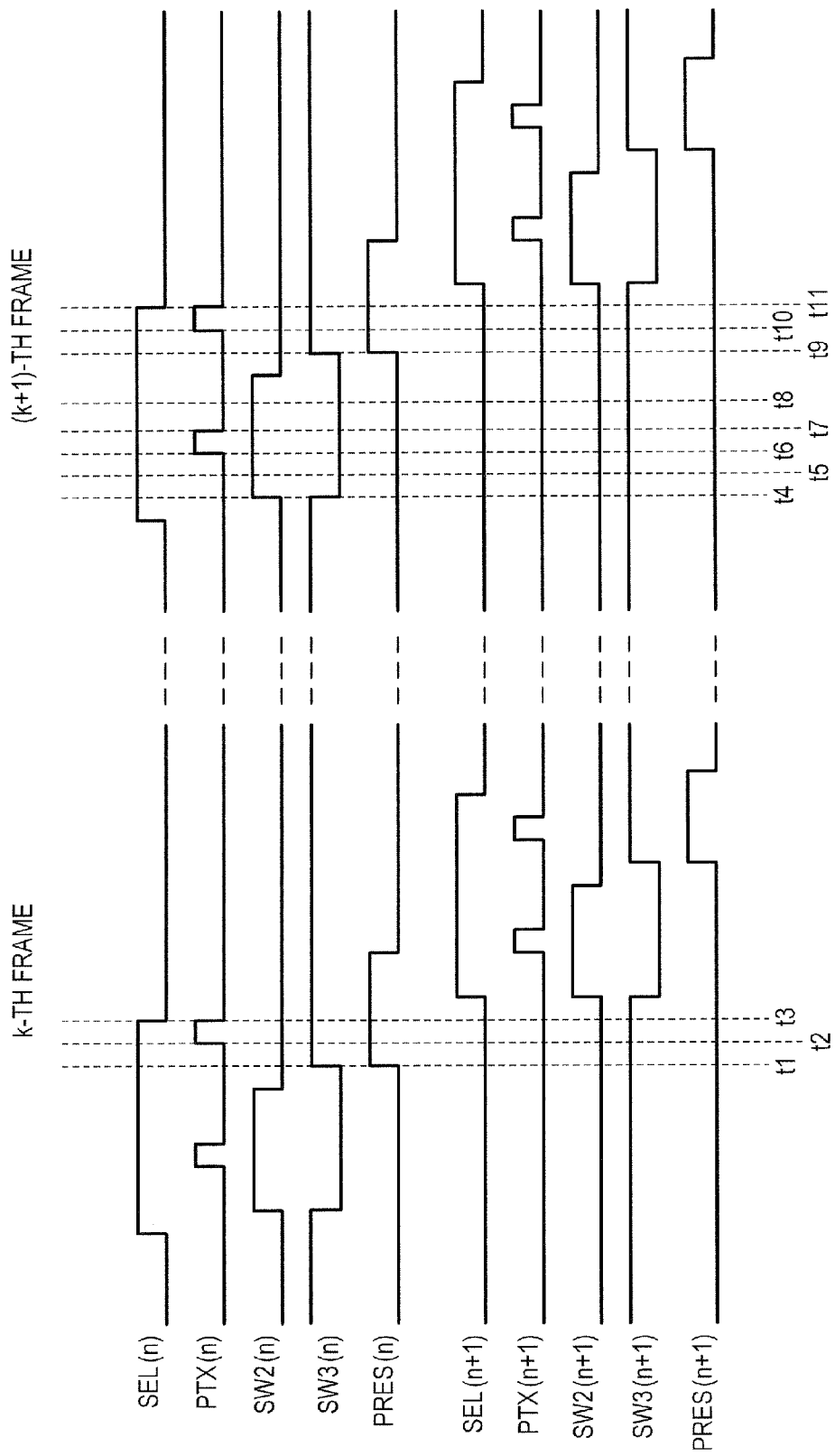
FIG. 11 is a drive timing chart of an imaging apparatus according to the third embodiment.

FIG. 10 is a circuit diagram of a pixel according to a third embodiment of the present invention. This embodiment differs from the first embodiment in that the first control transistor 316 is omitted. FIG. 11 is a drive timing chart illustrating the operation of the circuit illustrated in FIG. 10. The operation in the k-th frame and the (k+1)-th frame for the pixels of the n-th row and (n+1)-th row are illustrated in FIG. 11. The following describes the operation of the n-th pixel from starting the accumulation of charge to signal reading for obtaining the signal of the (k+1)-th frame. The description of the same operation timings as those in the first embodiment is omitted here.

At time t1, the control signals SW3(n) and PRES(n) become high, to turn on the third control transistor 318 and the reset transistor 309. As a result, a voltage of high level is applied to the gate of the transfer transistor 306, to turn on the transfer transistor 306.

At time t4, SW2(n) becomes high and SW3(n) becomes low, to turn on the second control transistor 317 and turn off the third control transistor 318. This turns off the transfer transistor 306, as a result of which the flow of charge from the photoelectric conversion layer 302 into the first charge accumulating unit 305 stops and the accumulation ends. kTC noise which occurs when turning off the transfer transistor 306 can be reduced as the transfer transistor 306 operates in the subthreshold region during the accumulating period, as described in the first embodiment.

According to this embodiment, the first control transistor 316 is omitted, thus reducing the number of transistors and the number of control lines in the pixel unit. Therefore, a reduction in device area and a reduction in pixel pitch can be achieved in addition to the advantageous effects of the first embodiment.

Fourth Embodiment

Figure 12:
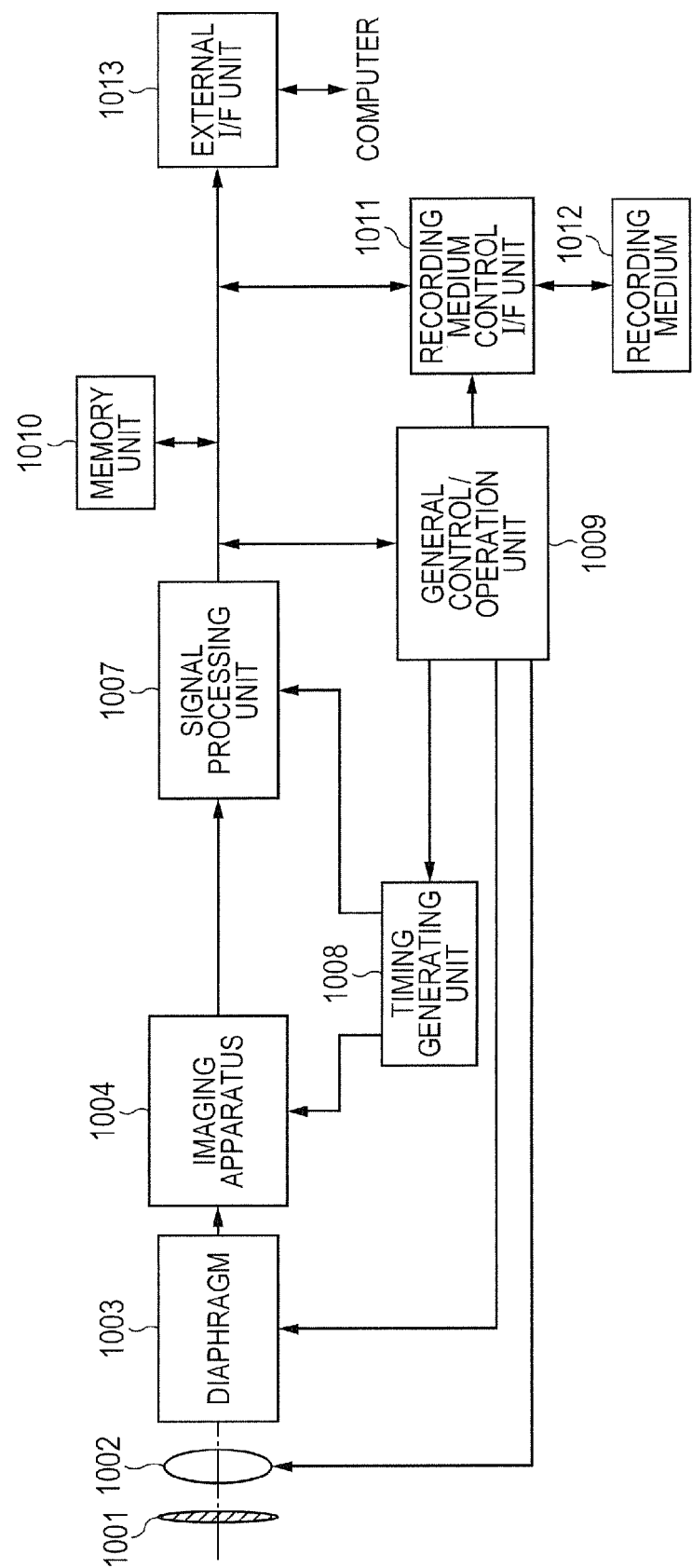
FIG. 12 is a block diagram of an imaging system according to a fourth embodiment.

An imaging system using the imaging apparatus according to any of the first to third embodiments is described as a fourth embodiment of the present invention below. Examples of the imaging system include a digital still camera, a digital camcorder, a camera head, a copier, a fax machine, a mobile phone, an in-vehicle camera, and an observation satellite. FIG. 12 is a block diagram of a digital still camera for describing an example of the structure of the imaging system in this embodiment.

In FIG. 12, the imaging system includes a barrier 1001 for lens protection, a lens 1002 for forming an optical image of a subject on an imaging apparatus 1004, and a diaphragm 1003 for adjusting the quantity of light passing through the lens 1002. The imaging apparatus 1004 is the imaging apparatus according to any of the first to third embodiments described above, and converts the optical image formed by the lens 1002 into image data.

The imaging system further includes a signal processing unit 1007, a timing generating unit 1008, a general control/ operation unit 1009, a memory unit 1010, a recording medium control interface (I/F) unit 1011, a recording medium 1012, and an external I/F unit 1013. The signal processing unit 1007 performs various processing such as noise correction and data compression on the image data output from the imaging apparatus 1004. The timing generating unit 1008 outputs various timing signals to the imaging apparatus 1004 and the signal processing unit 1007. The general control/operation unit 1009 controls the whole digital still camera. The memory unit 1010 temporarily stores the image data. The recording medium control I/F unit 1011 is an I/F unit for recording or reading the image data on the recording medium 1012. The recording medium 1012 is a removable recording medium such as semiconductor memory or a recording medium internal to the imaging system, for recording or reading the image data. The external I/F unit 1013 is an I/F unit for communicating with an external computer and the like.

The timing signals may be input from outside the imaging system. The imaging system only needs to include at least the imaging apparatus 1004 and the signal processing unit (signal processing apparatus) 1007 for processing the image signal output from the imaging apparatus 1004.

In the imaging apparatus 1004, the pixel unit 100 and the A/D conversion unit 103 may be formed in separate semiconductor substrates or the same semiconductor substrate. Moreover, the imaging apparatus 1004 and the signal processing unit 1007 may be formed in the same semiconductor substrate.

Each pixel may include a first photoelectric conversion unit 220A and a second photoelectric conversion unit 220B. The signal processing unit 1007 may process a signal based on a charge generated in the first photoelectric conversion unit 220A and a signal based on a charge generated in the second photoelectric conversion unit 220B, and obtain distance information from the imaging apparatus 1004 to the subject.

The imaging system according to the fourth embodiment includes the imaging apparatus according to any of the first to third embodiments that can reduce kTC noise upon charge transfer. An imaging system capable of obtaining an image with reduced noise can thus be provided according to this embodiment.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-155947, filed Jul. 31, 2014, which is hereby incorporated by reference herein in its entirety.

What is claimed is:

1. An imaging apparatus comprising:
    a substrate;
    a photoelectric conversion unit configured to generate a signal charge by photoelectric conversion;
    a contact wiring of a conductor electrically connected to the photoelectric conversion unit;
    a transistor including a control electrode, a first main electrode electrically connected to the contact wiring, and a second main electrode;
    a charge accumulating unit provided in the substrate and electrically connected to the second main electrode of the transistor; and
    a first switching unit configured to switch connection and disconnection between the control electrode and the first main electrode of the transistor.

2. The imaging apparatus according to claim 1, further comprising
    a second switching unit configured to switch connection and disconnection between the control electrode of the transistor and a node supplied with a ground voltage.

3. The imaging apparatus according to claim 2, further comprising
    a third switching unit configured to switch connection and disconnection between the control electrode of the transistor and a node supplied with a power supply voltage.

4. The imaging apparatus according to claim 1, wherein the photoelectric conversion unit is apart from the substrate with an interlayer insulating layer therebetween.

5. The imaging apparatus according to claim 1, wherein the photoelectric conversion unit includes a first electrode, a second electrode formed between the first electrode and the substrate, and a photoelectric conversion layer formed between the first electrode and the second electrode, and
    wherein the second electrode is electrically connected to the contact wiring.

6. The imaging apparatus according to claim 5, wherein the photoelectric conversion unit further includes an insulating layer formed between the second electrode and the photoelectric conversion layer to provide electrical insulation between the second electrode and the photoelectric conversion layer.

7. The imaging apparatus according to claim 5, wherein the photoelectric conversion unit further includes a blocking layer between the photoelectric conversion layer and the first electrode.

8. The imaging apparatus according to claim 5, wherein a global shutter operation is enabled by discharging a charge accumulated in the photoelectric conversion layer according to a voltage applied from the first electrode.

9. The imaging apparatus according to claim 8, wherein a rolling shutter operation is enabled by setting the transistor in a connected state.

10. The imaging apparatus according to claim 5, wherein the photoelectric conversion layer includes a quantum dot.

11. The imaging apparatus according to claim 1, comprising:
    an amplifying unit; and
    a charge transfer transistor configured to control transfer of a charge between the second main electrode of the transistor and the amplifying unit.

12. An imaging apparatus comprising:
    a substrate;
    a photoelectric conversion unit configured to generate a signal charge by photoelectric conversion, the photoelectric conversion unit including a first electrode, a second electrode formed between the first electrode and the substrate, and a photoelectric conversion layer formed between the first electrode and the second electrode;
    a contact wiring of a conductor electrically connected to the second electrode of the photoelectric conversion unit;
    a transistor including a control electrode, a first main electrode electrically connected to the contact wiring, and a second main electrode;
    a charge accumulating unit provided in the substrate and electrically connected to the second main electrode of the transistor; and a switch disposed in an electrical path between the control electrode and the first main electrode of the transistor.

13. An imaging system comprising:
the imaging apparatus according to claim 1; and
a signal processing apparatus configured to process an image signal output from the imaging apparatus.

14. The imaging system according to claim 13, wherein the imaging apparatus includes a plurality of pixels arranged in matrix,
wherein each of the plurality of pixels includes two photoelectric conversion units, and
wherein the signal processing apparatus processes respective image signals generated in the two photoelectric conversion units to obtain distance information from the imaging apparatus to a subject.

15. An imaging system comprising:
the imaging apparatus according to claim 12; and
a signal processing apparatus configured to process an image signal output from the imaging apparatus.

16. The imaging system according to claim 15, wherein the imaging apparatus includes a plurality of pixels arranged in matrix,
wherein each of the plurality of pixels includes two photoelectric conversion units, and
wherein the signal processing apparatus processes respective image signals generated in the two photoelectric conversion units to obtain distance information from the imaging apparatus to a subject.

* * * * *